United States Patent [19]
Rode et al.

[11] Patent Number: 4,983,498
[45] Date of Patent: Jan. 8, 1991

[54] PHOTOPOLYMERIZABLE MIXTURE AND RECORDING MATERIAL PRODUCED THEREFROM

[75] Inventors: Klaus Rode, Wiesbaden; Dieter Mohr, Budenheim; Werner Frass, Wiesbaden, all of Fed. Rep. of Germany

[73] Assignee: Hoechst Aktiengesellschaft, Frankfurt am Main, Fed. Rep. of Germany

[21] Appl. No.: 173,559

[22] Filed: Mar. 23, 1988

[30] Foreign Application Priority Data

Mar. 28, 1987 [DE] Fed. Rep. of Germany ....... 3710281

[51] Int. Cl.$^5$ .............................................. G03C 7/029
[52] U.S. Cl. ..................... 430/284; 430/915; 522/25; 522/26; 522/95
[58] Field of Search ............... 522/26, 25, 95; 430/915, 284; 525/278

[56] References Cited

U.S. PATENT DOCUMENTS

| | | | |
|---|---|---|---|
| 3,097,096 | 7/1963 | Oster | 96/30 |
| 3,488,269 | 1/1970 | Allen et al. | 204/159.23 |
| 3,597,343 | 8/1971 | Delzenne et al. | 204/159.23 |
| 3,759,807 | 9/1973 | Osborn et al. | 204/159.23 |
| 3,782,961 | 1/1974 | Takahashi et al. | 96/115 R |
| 3,850,770 | 11/1974 | Juna et al. | 204/159.19 |
| 3,864,133 | 2/1975 | Hisamatsu et al. | 430/184 |
| 3,960,572 | 6/1976 | Ibata et al. | 96/115 P |
| 4,019,972 | 4/1977 | Faust | 204/159.15 |
| 4,054,682 | 10/1977 | Kuesters et al. | 427/54 |
| 4,071,424 | 1/1978 | Dart et al. | 204/159.15 |
| 4,250,248 | 2/1981 | Faust | 430/284 |
| 4,279,982 | 7/1981 | Iwasaki | 430/170 |
| 4,339,566 | 7/1982 | Rosenkrenz | 528/68 |
| 4,458,007 | 7/1984 | Geissler et al. | 430/284 |
| 4,495,271 | 1/1985 | Geissler et al. | 430/277 |
| 4,559,382 | 12/1985 | Martens | 524/535 |
| 4,636,459 | 1/1987 | Kawamura | 430/288 |
| 4,650,743 | 3/1987 | Galloway | 430/278 |
| 4,732,840 | 3/1988 | Hasegawa | 430/302 |
| 4,810,618 | 3/1989 | Koike et al. | 430/281 |
| 4,814,257 | 3/1989 | Galloway | 430/278 |

FOREIGN PATENT DOCUMENTS 262242 4/1988 European Pat. Off. .

OTHER PUBLICATIONS

Chemical Abstracts, 74-Radiation Chem., Photochem. vol. 85, 1976, 85:5462a, Photoresists for Printing Platemaking and Printed Circuit Fabrication, p. 555.

*Primary Examiner*—Marion C. McCamish
*Assistant Examiner*—Christopher D. Rodee
*Attorney, Agent, or Firm*—Foley & Lardner, Schwartz, Jeffery, Schwaab, Mack, Blumenthal & Evans

[57] ABSTRACT

A photopolymerizable mixture is disclosed comprising:
(a) a polymeric binder,
(b) an acrylate or alkacrylate of a polyhydric alcohol containing one or more groups which are photooxidizable on exposure in the presence of the photoreducible dye, and one or more urethane groups,
(c) a photoreducible dye as photoinitiator,
(d) a trihalomethyl compound which can be cleaved by irradiation, and
(e) an acridine or phenazine compound which is active as a photoinitiator.

The mixture is suitable for the production of printing plates and photoresists and is distinguished by increased photosensitivity.

19 Claims, No Drawings

PHOTOPOLYMERIZABLE MIXTURE AND RECORDING MATERIAL PRODUCED THEREFROM

BACKGROUND OF THE INVENTION

The present invention relates to a photopolymerizable mixture which contains a polymeric binder, a polymerizable compound having at least two acrylate or alkacrylate groups in the molecule, and a photoinitiator combination.

Photopolymerizable mixtures which contain acrylates and/or methacrylates as photopolymerizable compounds are known. For the production of photoresist materials, in particular dry photoresist coatings, mixtures are preferred which contain acrylates or methacrylates having urethane groups in the molecule and which can be developed using aqueous alkaline solutions. Such mixtures are described, for example, in German Offenlegungsschrift No. 2,822,190, German Auslegeschrift No. 2,115,373, German Patent No. 2,361,041 and U.S. Pat. Nos. 3,850,770 and No. 3,960,572.

On the other hand, photopolymerizable mixtures are also known which, in order to increase the photosensitivity, contain certain combinations of photoinitiators and activators, for example carbonyl-group-containing initiators and tertiary amines. Such mixtures with a synergistic action are described, for example, in German Offenlegungsschriften No. 2,602,419 and No. 2,251,048 and U.S. Pat. No. 3,759,807. A disadvantage of these mixtures which contain low-molecular-weight amines is that they have a short shelf life since the amines can easily bleed out, in particular from thin coatings.

In Japanese Patent Application No. 50/129,214, a photopolymerizable mixture is described which contains a tetra(meth)acrylate of a N'N'N',N'-tetrahydroxyalkylalkylenediamine as polymerizable compound. The tetrafunctional compound serves as a crosslinking agent.

It is furthermore known that the free-radical polymerization of ethylenically unsaturated compounds can be initiated by irradiation with visible light in the presence of photoreducible dyes and reducing agents, for example amines (U.S. Pat. No. 3,097,096). However, these initiator combinations are essentially employed only in aqueous solution or in combination with water-soluble binders.

Initiator combinations of photoreducible dyes and other reducing agents are described in U.S. Pat. No. 3,597,343 and No. 3,488,269. Photopolymerizable mixtures which contain exclusively photoreducible dyes as initiators have hitherto not been employed in practice due to their inadequate photosensitivity.

In Japanese Patent Application No. 54/151,024, a photopolymerizable mixture is described which contains an initiator combination of a merocyanine dye and a trihalomethyl-substituted s-triazine and is sensitive towards visible light, for example an argon laser. However, the sensitivity of these mixtures towards visible laser light is inadequate for economic utilization.

SUMMARY OF THE INVENTION

It is therefore an object of the present invention to provide photopolymerizable mixtures which are suitable for the production of printing plates for long runs.

It is a further object of the invention to provide photoresists having high resistance in the hardened state to processing solutions and high photosensitivity in the near ultra-violet and visible spectral regions, and therefore being suitable, in particular, for laser beam recording in the visible region.

These and other objects are achieved by providing a photopolymerizable mixture comprising a polymeric binder, present in an amount sufficient to produce a uniform film, an acrylate or alkacrylate of a polyhydric alcohol, comprising one or more groups which are photooxidizable on exposure in the presence of a photoreducible dye, and one or more urethane groups, present in an amount sufficient to render exposed areas of said photopolymerizable mixture insoluble in developer solution, a photoreducible dye as a photoinitiator, a trihalomethyl compound which can be cleaved by irradiation, and an acridine, phenazine or quinoxaline compound which acts as a photoinitiator wherein components c, d, and e are present in an amount sufficient to increase the sensitivity of the mixture. The present invention also provides a photopolymerizable recording material comprising a layer support and a layer of the photopolymerizable mixture.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

According to the invention, a photopolymerizable mixture is provided which contains, as essential components, (a) a polymeric binder,
(b) an acrylate or alkacrylate of a polyhydric alcohol, and
(c) a photoreducible dye as photoinitiator.

The mixture according to the invention additionally comprises (d) a trihalomethyl compound which can be cleaved by irradiation, and
(e) an acridine, phenazine or quinoxaline compound which acts as photoinitiator, and one or more groups on the acrylate or alkacrylate which are photooxidizable on exposure in the presence of the photoreducible dye, and one or more urethane groups on the acrylate or alkacrylate.

Suitable photooxidizable groups are, in particular, amino groups, thio groups, which can also be components of heterocyclic rings, enol groups and carboxyl groups in combination with olefinic double bonds. Examples of such groups are triethanolamino, triphenylamino, thiourea, imidazole, oxazole, thiazole, acetylacetonyl, N-phenylglycine and ascorbic acid groups. Polymerizable compounds containing primary, secondary and, in particular, tertiary amino groups are preferred.

Acrylates and alkacrylates of the formula I

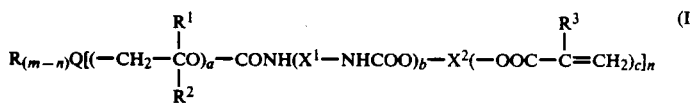

in which

Q denotes

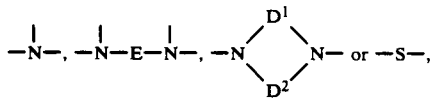

R denotes an alkyl, hydroxyalkyl or aryl group,
R$^1$ and R$^2$ each denote a hydrogen atom, an alkyl group or an alkoxyalkyl group,
R$^3$ denotes a hydrogen atom, a methyl group or an ethyl group,
X$^1$ denotes a saturated hydrocarbon group having 2 to 12 carbon atoms,
X$^2$ denotes a (c+1)-valent saturated hydrocarbon group in which up to 5 methylene groups may be replaced by oxygen atoms,
D$^1$ and D$^2$ each denote a saturated hydrocarbon group having 1 to 5 carbon atoms,
E denotes a saturated hydrocarbon group having 2 to 12 carbon atoms, a cycloaliphatic group which has 5 to 7 ring members and which contains up to 2 N, O or S atoms as ring members, an arylene group having 6 to 12 carbon atoms, or a heterocyclic aromatic group having 5 or 6 ring members,
a denotes 0 or an integer from 1 to 4,
b denotes 0 or 1,
c denotes an integer from 1 to 3,
m denotes 2, 3 or 4, depending on the valency of Q, and
n denotes an integer from 1 to m,
it being possible for all radicals of the same definition to be identical to or different from one another, are particularly advantageously used.

The compounds of this formula, and their preparation and use are described in detail in copending application Ser. No. 173,936 (corresponding to German Patent Application No. P 3,710,279.6, filed simultaneously herewith, the contents of which are hereby incorporated by reference.

In the further copending application Ser. No. 174,426 (corresponding to German Patent Application No. P 3,710,282.6, filed simultaneously herewith, the contents of which are also hereby incorporated by reference, photopolymerizable mixtures are described which contain these polymerizable compounds in combination with photoreducible dyes and, where appropriate, trihalomethyl compounds which can be cleaved by irradiation as photoinitiators.

Where, in the compound of the general formula I, more than one R radical or more than one radical of the type mentioned in brackets is bound to the central group Q, these radicals may be different from one another.

Compounds in which all substituents of Q are polymerizable radicals, i.e., in which m =n, are generally preferred.

In general, a=0 in not more than one radical, and preferably a=1.

If R is an alkyl or hydroxyalkyl group, it generally has from 2 to 8, preferably from 2 to 4, carbon atoms.

The aryl group R can generally be mononuclear or dinuclear, preferably mononuclear, and optionally substituted by alkyl or alkoxy groups having up to 5 carbon atoms or halogen atoms.

If R$^1$ and R$^2$ are alkyl or alkoxyalkyl groups, they can contain 1 to 5 carbon atoms.

R$^3$ is preferably a hydrogen atom or a methyl group, in particular a methyl group.

X$^1$ is preferably a straight-chain or branched aliphatic or cycloaliphatic radical preferably having 4 to 10 carbon atoms.

X$^2$ preferably has from 2 to 15 carbon atoms, of which up to 5 may be replaced by oxygen atoms. If these are pure carbon chains, those having from 2 to 12, preferably from 2 to 6, carbon atoms are generally employed. X$^2$ can also be a cycloaliphatic group having from 5 to 10 carbon atoms, in particular a cyclohexyl group.

D$^1$ and D$^2$ may be identical or different and, together with the two nitrogen atoms, form a saturated heterocyclic ring having from 5 to 10, preferably 6, ring members.

If E is an alkylene group, it preferably has from 2 to 6 carbon atoms, and as an arylene group it is preferably a phenylene group. As cycloaliphatic groups, cyclohexylene groups are preferred, and as aromatic heterocyclic rings, those containing N or S as heteroatoms and having 5 or 6 ring members are preferred.

The value of c is preferably 1.

The polymerizable compounds of the formula I where Q=N and n=m and which contain two urethane groups in each radical (b=1) are prepared by reacting acrylates or alkylacrylates which contain free hydroxyl groups in a known fashion with the same number of moles of diisocyanates, and reacting the excess isocyanate groups with hydroxyalkylamines. When a=0, a urea group is produced.

Examples of the hydroxyalkylamines used as starting materials are triethanolamine, N-alkyl-N,N-di(hydroxyalkyl)amines, diethanolamine, tris-(2-hydroxypropyl)amine or tris-(2-hydroxybutyl)amine.

Examples of diisocyanates used as starting materials are ethylene diisocyanate, propylene diisocyanate, butylene 1,3-diisocyanate, hexamethylene diisocyanate, 2,2,4-trimethylhexamethylene diisocyanate, 2,4-dimethyl-6-ethyloctamethylene diisocyanate, 1,4-cyclohexylene diisocyanate, 1,3-cyclopentylene diisocyanate, 1,4-diisocyanatomethylcyclohexane and 1,1,3-trimethyl-3-isocyanatomethyl-5-isocyanatocyclohexane.

The hydroxyl group-containing esters used are, in particular, hydroxyethyl methacrylate and hydroxypropyl methacrylate (n or iso), and furthermore the corresponding acrylates. However, the following compounds can also be used with advantage: 2-hydroxybutyl methacrylate, 4-hydroxybutyl methacrylate, 2-hydroxycyclohexyl methacrylate and other hydroxyalkyl methacrylates having up to 12, preferably up to 6, carbon atoms in the alkyl radical, diethylene glycol monomethacrylate, triethylene glycol monomethacrylate and other polyethylene glycol monomethacrylates having up to 5 oxyethylene units, trimethylolethane dimethacrylate, trimethylolpropane dimethacrylate, pentaerythritol trimethacrylate and the corresponding acrylates.

The polymerizable compounds of the formula I where n=3 and b=0 are prepared by reacting the above-described hydroxyalkylamines with isocyanate-group-containing acrylates or alkylacrylates.

The isocyanate group-containing ester employed is, in particular, isocyanatoethyl (meth)acrylate. However, the following compounds can also be used with advantage: 3-isocyanatopropyl methacrylate, 4-isocyanatobutyl methacrylate, isocyanatoisohexyl methacrylate and other isocyanatoalkyl (meth)-acrylates having up to 12, preferably up to 6, carbon atoms in the alkyl radical.

The polymerizable compounds of the formula I where

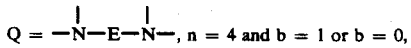

$Q = -N-E-N-$, n = 4 and b = 1 or b = 0, are prepared analogously to the polymerizable compounds where Q=N.

The polymerizable compounds of the formula I where

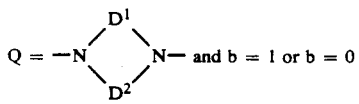

are likewise prepared analogously to the above-described polymerizable compounds.

The reaction of isocyanates with the OH-group-containing amines and alkylacrylates is expediently carried out in an inert solvent such as toluene, pyridine or methyl ethyl ketone. In order to thermally stabilize the products, which have a great tendency towards polymerization, quinones, preferably benzoquinone, are added in concentrations of 0.01%-2% by weight.

The compounds where Q=S are prepared analogously to the general procedures given above, starting from the appropriate bis-hydroxyalkyl sulfide.

Besides other components, the above-described polymerizable compounds are responsible for the very high photosensitivity of the photopolymerizable mixtures.

In addition to the photooxidizable polymerizable compounds described, conventional polymerizable compounds which contain two or more polymerizable acrylate or methacrylate groups can also be added. Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols. The products of the reaction of diisocyanates with partial esters of polyhydric alcohols can also be employed with advantage. Such monomers are described in German Offenlegungsschriften No. 2,064,079; No. 2,361,041 and No. 2,822,190.

The proportion of monomers in the mixture is generally about 10 to 80, preferably about 20% to 60% by weight.

The mixture according to the invention contains a photoreducible dye as photoinitiator component. Suitable dyes are, in particular, xanthene, thiazine, pyronine, porphyrine or acridine dyes. Preferred representatives of xanthene dyes are compounds of the general formula II

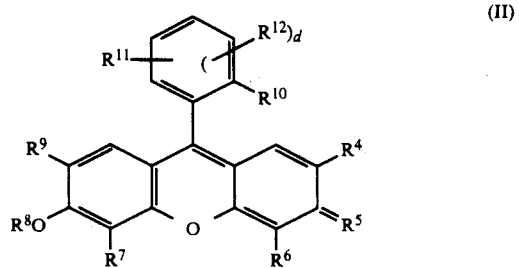

in which
R$^4$ and R$^9$ are identical or different and denote hydrogen or halogen atoms, nitro or hydroxyl groups or groups of the formula —HgOH,
R$^6$ and R$^7$ are identical or different and denote hydrogen or halogen atoms or hydroxyl groups,
R$^5$ denotes O or (+)NHalkyl X(−),
R$^8$ denotes a hydrogen atom, an alkali metal, ammonium or trialkylammonium cation, or an alkyl or acyl group,
R$^{10}$ denotes a hydrogen atom or a COOR$^{13}$ group,
R$^{11}$ denotes a hydrogen or halogen atom or an amino group,
R$^{12}$ denotes a hydrogen or halogen atom,
R$^{13}$ denotes a hydrogen atom, an alkali metal or ammonium cation, an alkyl group or a polymeric radical,
X denotes an anion, and
d denotes zero or an integer from 1 to 3.

If the radicals R$^5$, R$^8$ and R$^{13}$ are or contain alkyl radicals, the latter generally have from 1 to 25, in particular from 1 to 18, carbon atoms.

In practice, the photopolymerizable recording material according to the invention frequently contains an oxygen-inhibiting protective coating. If a xanthene dye is present in this coating, this leads to shadowing of the photosensitive layer below and thus to a decrease in sensitivity. Therefore, dyes of the formula II whose alkyl radicals R$^5$, R$^8$ and, particularly, R$^{13}$ are relatively long-chain and thereby prevent migration into the protective coating are used with advantage in the photopolymerizable layer. Dyes of the formula II whose R$^{13}$ radical is an alkyl radical having more than 8 carbon atoms are used with particular advantage.

Suitable thiazine dyes are compounds of the formula III, and suitable pyronine dyes are compounds of the formula IV

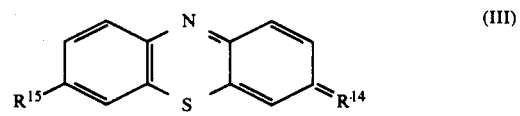

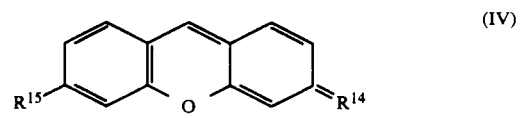

in which
R$^{14}$ is one of the groups =NH$_2$(+) X(−), =NHalkyl(+) X(−) and =N(alkyl)$_2$(+) X(−), $R^{15}$ is an amino, alkylamino or dialkylamino group and X is an anion.

In the formulae III and IV, alkyl groups have the same meanings as in the formula II.

A suitable porphyrine dye is, for example, hematoporphyrine, and a suitable acridine dye is, for example, acriflavinium chloride hydrochloride. Examples of compounds of the formula II are Eosine B (C.I. No. 45 400), Eosine J (C.I. No. 45 380), alcohol-soluble Eosine (C.I. 45 386), Cyanosine (C.I. No. 45 410), Rose Bengal, Erythrosine (C.I. No. 45 430), 2,3,7-trihydroxy-9-phenylxanthen-6-one and Rhodamine 6 G (C.I. No. 45 160).

Examples of compounds of the formula III are Thionine (C.I. No. 52 000), Azure A (C.I. No. 52 005) and Azure C (C.I. No. 52 002).

Examples of dyes of the formula IV are Pyronine B (C.I. No. 45 010) and Pyronine GY (C.I. No. 45 005). The amount of component (c) in the mixture is generally between about 0.01 and 10, preferably between about 0.05% and 4% by weight, relative to the nonvolatile components of the mixture.

In order to increase the photosensitivity, the mixtures according to the invention contain compounds having trihalomethyl groups (d) which can be removed photolytically and which are known per se as free-radical-forming photoinitiators for photopolymerizable mixtures. As such coinitiators, compounds containing chlorine and bromine, in particular chlorine, as halogens have proven particularly successful. The trihalomethyl groups can be bound directly to an aromatic carbocyclic or heterocyclic ring or via a conjugated chain. Preferred compounds are those containing a triazine ring in the basic structure, which preferably carries 2 trihalomethyl groups, in particular those which are described in European Patent Application No. 137,452; German Offenlegungsschriften No. 2,718,259 and No. 2,243,621. These compounds exhibit strong light absorption in the near UV region, at about 350-400 nm. Coinitiators are also suitable which absorb only little, or not at all in the spectral region of the copying light such as trihalomethyltriazines which contain substituents having relatively short mesomerism-capable electron systems or aliphatic substituents. Compounds having another basic structure which absorb in the shorter-wave UV region, for example phenyl trihalomethyl sulfones or phenyl trihalomethyl ketones, for example phenyl tribromomethyl sulfone, are also suitable.

The components (d) are generally employed in an amount from about 0.01 to 10, preferably from about 0.05% to 6% by weight, relative to the nonvolatile components of the mixture.

The mixtures according to the invention contain an acridine, phenazine or quinoxaline compound (e) as a further initiator component. These compounds are known as photoinitiators and are described in German Patents No. 2,027,467 and No. 2,039,861. Due to these compounds, the sensitivity of the mixture is increased, above all in the near ultra-violet region. Suitable representatives of this class of compounds are described in these German references. Examples are 9-substituted acridines, such as 9-phenyl-, 9-p-methoxyphenyl- or 9-acetylaminoacridine, or acridine derivatives containing fused aromatic nuclei, for example benz(a)acridine. A suitable phenazine derivative is, for example, 9,10-dimethylbenz(a)phenazine.

Suitable quinoxaline derivatives are, in particular, the 2,3-diphenyl derivatives which are preferably further substituted in the two phenyl radicals by methoxy groups. In general, the acridine derivatives are preferred as components (e).

The amount of component (e) in the mixture is likewise in the range from about 0.01% to 10% by weight, preferably between about 0.05% and 5% by weight.

If a further increase in the sensitivity of the mixture in the visible spectral region is desired, this can be achieved by adding a compound (f) of the dibenzalacetone or coumarine type. This addition causes higher resolution in the copy and continuous sensitization of the mixture for the visible spectral region up to wavelengths of about 600 nm. Suitable representatives of these compounds are 4,4'-disubstituted dibenzalacetones, for example 4-diethylamino-4'-methoxydibenzalacetone, or coumarine derivatives such as 3-acetyl-7-diethylamino-, 3-benzimidazolyl-7-diethylamino- or carbonyl-bis-(7-diethylaminocoumarine). The amount of compound (f) is likewise in the range from about 0.01 to 10, preferably from about 0.05% to 4% by weight, relative to the nonvolatile components in the mixture.

The total amount of polymerization initiators (c), (d) and (e), or where appropriate the total amount including component (f), is generally about 0.05 to 20%, preferably about 0.1 to 10% by weight. The molar ratio of components (c), (d), (e) and (f) to one another is preferably in the following ranges (c):(d):(e):(f) = 1: (4-10):(1-5):(0-4).

Binders which can be employed include a large number of soluble organic polymers. Examples which may be mentioned are: polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers listed.

Further suitable binders are natural substances or converted natural substances, for example gelatin and cellulose ethers.

Binders which are insoluble in water but soluble, or at least swellable, in aqueous-alkaline solutions are used with particular advantage since layers containing such binders can be developed using the preferred aqueous alkaline developers. Such binders can contain, for example, the following groups: —COOH, —$PO_3H_2$, —$SO_3H$; —$SO_2NH$—, —$SO_2$—NH—$SO_2$ and —$SO_2$—NH—CO—.

Examples of these which may be mentioned are: maleic resins, polymers made from β-(methacryloyloxy)-ethyl N-(p-tolylsulfonyl)carbamate, and copolymers of these and similar monomers with other monomers, and also vinyl acetate/crotonic acid and styrene/maleic anhydride copolymers. Alkyl methacrylate/methacrylic acid copolymers and copolymers made from methacrylic acid, higher alkyl methacrylates and methyl methacrylate and/or styrene, acrylonitrile and the like, as described in German Offenlegungsschriften No. 2,064,080 and No. 2,363,806, are preferred.

The amount of binders is generally about 20 to 90%, preferably about 30 to 80% by weight, of the components of the coating.

Depending on the planned use and depending on the desired properties, the photopolymerizable mixtures can contain a wide variety of substances as additives. Examples are: inhibitors for preventing thermal polymerization of the monomers, hydrogen donors, dyes, colored and colorless pigments, substances by which the sensitometric properties of the mixtures are modified plasticizers, such as polyglycols, or chain-transfer agents.

These components are expediently selected so that they absorb as little as possible in the actinic radiation region which is important for the initiation process.

In the context of this description, actinic radiation should be understood as any radiation whose energy corresponds at least to that of short-wave visible light. Suitable above all is visible light and long-wave UV radiation, but also short-wave UV radiation, laser radiation, electron radiation and X-ray radiation.

The photopolymerizable mixture can be used for a very wide variety of applications, for example, for the production of paints which are hardened by light, as dental fillings or tooth replacement material and, in particular, as photosensitive recording material in the reproduction field.

The detailed description of the invention is limited to this latter area of application, but the invention is not limited thereto. Possible applications in this area which may be mentioned are: recording layers for photomechanical production of printing forms for letterpress printing, planographic printing, rotogravure printing, screen printing, of relief copies, for example the production of braille texts, of individual copies, tanned images, pigmented images, etc. In addition, the mixtures can be used for photomechanical production of etch resists, for example for the production of nameplates, of copied circuits and for chemical milling. The mixtures according to the invention have particular importance as copying layers for the production of planographic printing plates and for the photoresist technique.

The commercial utilization of the mixture for the applications mentioned can take place in the form of a liquid solution or dispersion, for example as a photoresist solution which is applied by the consumer himself to an individual support, for example for chemical milling, for the production of copied circuits, of screen-printing stencils and the like. The mixture can also be present as a solid, photo-sensitive coating on a suitable support in the form of a storable, pre-coated, photo-sensitive copying material, for example for the production of printing plates. It is likewise suitable for the production of dry resist materials.

It is generally favorable to keep the mixture away from the influence of atmospheric oxygen during the photopolymerization. When the mixture is used in the form of thin copying layers, it is advisable to apply a suitable protective film which is impermeable to oxygen. This can be self-supporting and removed before development of the copying layer. For this purpose, polyester films, for example, are suitable. The protective film can also comprise a material which dissolves in the developer liquid or can at least be removed during development from the non-hardened areas. Materials which are suitable for this purpose are, for example, waxes, polyvinyl alcohol, polyphosphates, sugars, etc. Such protective coatings generally have a thickness of about 0.1 to 10, preferably about 1 to 5, $\mu$m.

Suitable layer supports for copying materials produced using the mixtures according to the invention are, for example, aluminum, steel, zinc, copper and plastic films, for example, made from polyethylene terephthalate or cellulose acetate, and also screen-printing bases, such as Perlon gauze. In many cases, it is favorable to subject the support surface to pre-treatment (chemical or mechanical), the aim of which is to set the adhesion of the layer correctly, to improve the lithographic properties of the support surface or to reduce the reflectivity of the support in the actinic range of the copying layer (anti-halation).

The production of the light-sensitive materials using the mixtures according to the invention takes place in a known fashion. Thus, this mixture can be taken up in a solvent, and the solution or dispersion applied to the intended support by pouring, spraying, dipping, roll application, etc., and subsequently dried. Thick layers (e.g., of 250 $\mu$m and more) are advantageously produced by extrusion or press molding as a self-supporting film, the latter then being laminated, if desired, onto the support. In the case of dry resist, solutions of the mixture are applied to transparent supports and dried. The photo-sensitive layers—thickness between about 10 and 100 $\mu$m - are then likewise laminated onto the desired substrate together with the temporary support.

Due to the broad spectral sensitivity of the mixture according to the invention, all light sources known to those skilled in the art can be used, for example tubular lamps, xenon impulse lamps, metal-halide-doped mercury vapor high-pressure lamps and carbon arc lamps. In addition, exposure in conventional projectors and enlargers under the light of metal filament lamps, and contact exposure using conventional incandescent bulbs are possible in the case of the photosensitive mixtures according to the invention. Exposure can also take place using coherent light from a laser. Suitable for the purpose of the present invention are lasers of suitable power, for example argon ion, krypton ion, dye, helium/cadmium and helium/neon lasers, which emit, in particular, between 250 and 650 nm. The laser beam can be controlled by means of a pre-specified programmed line and/or dotwise movement.

The further processing of the materials is carried out in a known fashion. For better crosslinking of the layers, post-heating after exposure can take place. For development, they are treated with a suitable developer solution, for example with organic solvents, but preferably with a slightly alkaline aqueous solution, the unexposed parts of the layers being removed and the exposed areas of the copying layer remaining on the support. Illustrative embodiments of the invention are given below, with, firstly, a number of new polymerizable compounds being listed in Table I. These compounds are produced by one of the two processes given below. The compounds are employed as polymerizable compounds in the examples below in recording materials according to the invention. In the examples, parts by weight (pbw) and parts by volume (pbv) are in the ratio g to ccm. Percentage and weight ratios are taken to mean weight units, unless otherwise stated.

1. General procedure for the preparation of compounds of general formula I where $b=0$ (compounds 2, 3, 5 and 6 in Table I)

The hydroxyalkyl-group-containing amino compound and the i socy anatoalkyl (meth)acrylate are refluxed in the desired molar ratio in ten times the amount of the suitable solvent (toluene, butanone or pyridine) with 0.01% by weight of dibutyltin dilaurate and 0.01% by weight of benzoquinone until the isocyanate band (2275–2250 cm$^{-1}$) can no longer be detected in the IR spectrum (generally after 5 to 8 hours). The solvent is subsequently removed by distillation in vacuo at 50° C. The unsaturated compound remains in virtually quantitative yield as a viscous residue.

2. General procedure for the preparation of compounds of the general formula I where b=1 (compounds 1 and 4 in Table I).

Hydroxyalkyl (meth)acrylate and diisocyanate are refluxed for 8 hours in the molar ratio 1:1 in ten times the amount of solvent (toluene, butanone or pyridine) with 0.01% by weight of dibutyltin dilaurate and 0.01% by weight of benzoquinone, and the desired number of moles of hydroalkylamine is subsequently added and the mixture refluxed further until the isoCyanate band has disappeared in the IR spectrum (generally after 5-8 hours). The solvent is subsequently removed by distillation in vacuo at 50° C. The unsaturated compound remains in virtually quantitative yield as a viscous residue.

110 cm under a 13 step exposure wedge which contained density increments of 0.15 and on which, where specified, a silver film of uniform optical density (density 1.57) and uniform absorption over the effective spectral range had additionally been mounted as a neutral density filter. In order to test the sensitivity of the printing plate in visible light, a 3 mm thick sharp cut-off filter from Schott having the cut-off transmissions given in the table was mounted in each case on the exposure wedge. After exposure, the plate was warmed at 100.C for one minute. It was subsequently developed in a developer of the following composition:

pbw of sodium metasilicate . 9 $H_2O$
2.13 pbw of strontium chloride,
1.2 pbw of non-ionogenic wetting agent (coconut fat alcohol polyoxyethylene ether containing about 8 oxyethylene units) and
0.12 pbw of antifoamer in
4000 pbw of demineralized water.

TABLE I

| Comp. No. | Compounds of the general formula I where $R^2$ = H; $R^3$ = $CH_3$; $X^2$ = $C_2H_4$ | | | | | | | | | |
|---|---|---|---|---|---|---|---|---|---|---|
| | Q | R | $R^1$ | a | $X^1$ | b | m | n | $N_{calc.}$ | $N_{found}$ |
| 1 | —N—<br>\| | — | H | 1 | * | 1 | 3 | 3 | 8.4 | 8.7 |
| 2 | —N—CH₂—CH₂—N—<br>\|   \| | — | $CH_3$ | 1 | — | 0 | 4 | 4 | 9.1 | 8.8 |
| 3 | ** | — | H | 1 | — | 0 | 2 | 2 | 11.6 | 11.9 |
| 4 | ** | — | H | 1 | * | 1 | 2 | 2 | — | — |
| 5 | —N—<br>\| | — | H | 1 | — | 0 | 3 | 3 | 9.1 | 8.8 |
| 6 | —N—<br>\| | $C_2H_4OH$ | — | 0 | — | 0 | 3 | 2 | 10.1 | 9.5 |

*2,2,4-trimethylhexamethylene
**piperidin-1,4-diyl

EXAMPLE 1

Electrochemically roughened and anodized aluminum which had an oxide layer of 3 g/m² and which had been pretreated with an aqueous solution of polyvinylphosphonic acid was used as the layer support for printing plates. The support was coated with a solution of the following composition:

2.84 pbw of a 22.3% strength solution of a terpolymer made from styrene, n-hexyl methacrylate and methacrylic acid (10:60:30) having the acid number 190 in methyl ethyl ketone,
1.49 pbw of a monomer in accordance with Table II,
0.04 pbw of alcohol - soluble Eosin e (C.I. 45 386),
0.03 pbw of 2,4-bis-trichloromethyl-6-(4-styrylphenyl)-s-triazine and
0.049 pbw of 9-phenylacridine in
22 pbw of propylene glycol monomethyl ether.

Application took place by spin-coating in a fashion such that a dry weight of 2.8 to 3 g/m² was obtained. The plate was subsequently dried for 2 minutes at 100° C. in a fan-assisted drying cabinet. The plate was then coated with a 15% strength aqueous solution of polyvinyl alcohol (12% of residual acetyl groups, K value 4). After drying, a protective layer having a weight of 4 to 5 g/m² was obtained. The printing plate obtained was exposed using a 5 kW metal halide lamp at a distance of The plate was inked with an oily printing ink. The following fully crosslinked wedge steps were obtained:

TABLE II

| Compound | Exposure (seconds) | Neutral density filter | Sharp cut-off filter | Wedge step |
|---|---|---|---|---|
| 1 | 40 | yes | — | 5 |
|   | 40 | no | 455 | 2 |
| 2 | 10 | yes | — | 5 |
|   | 10 | no | 455 | 2 |
| 3 | 10 | yes | — | 3 |
|   | 10 | no | 455 | 1 |
| 4 | 40 | yes | — | 5 |
|   | 40 | no | 455 | 5 |

EXAMPLE 2

A solution of the following composition was spin-coated onto the layer support specified in Example 1 under the same conditions as in Example 1 so that a layer weight of 2.5 g/m² was obtained:

2.8 pbw of the terpolymer solution given in Example 1,
1.4 pbw of compound 5,
0.02 pbw of dye,
0.03 pbw of the s-triazine given in Example 1, and 0.049 pbw of 9-phenylacridine in
22.0 pbw of propylene glycol monomethyl ether.

After application of a protective coating of polyvinyl alcohol, the plates were exposed and developed in the same way as in Example The following number of fully crosslinked wedge steps was obtained:

TABLE III

| Dye (C.I. No.) | Exposure time | Neutral density filter | Sharp cut-off filter | Wedge steps |
|---|---|---|---|---|
| Hematoporphyrine | 40 | yes | — | 8 |
|  | 40 | no | 455 | 6 |
| 2,3,7-Trihydroxy-9-phenylxanthen-6-one | 5 | yes | — | 6 |
|  | 5 | no | 455 | 1 |
| Thionine (52 000) | 40 | yes | — | 5 |
|  | 40 | no | 455 | ½ |
| Cyanosine (45 410) | 40 | yes | — | 9 |
|  | 40 | no | 455 | 3 |
| 2,7-Dichloro-fluorescein | 40 | yes | — | 10 |
|  | 40 | no | 455 | 3 |
| Vitamin B₂ | 5 | yes | — | 8 |
|  | 5 | no | 455 | 1 |
| Eosine J (45 380) | 40 | yes | — | 10 |
|  | 40 | no | 455 | 6 |
| Rose Bengal | 40 | yes | — | 8 |
|  | 40 | no | 455 | 4 |
| Erythrosine (45 430) | 40 | yes | — | 8 |
|  | 40 | no | 455 | 5 |
| Pyronine GY (45 005) | 40 | yes | — | 7 |
|  | 40 | no | 455 | 1 |
| Rhodamine 6 G (45 160) | 40 | yes | — | 11 |
|  | 40 | no | 455 | 2 |
| 4'-Amino-fluorescein | 40 | yes | — | 12 |
|  | 40 | no | 455 | 2 |

EXAMPLE 3

A solution of the following composition was spin-coated onto the layer support specified in Example 1 so that a layer weight of 2.5 g/m² was obtained:
2.8 pbw of the terpolymer solution given in Example 1,
1.4 pbw of compound 5,
0.02 pbw of Eosine (C.I. 45 386),
0.03 pbw of a halo compound acc. to Table IV,
0.049 pbw of 9-phenylacridine in
22.0 pbw of propylene glycol monomethyl ether.

The plates were processed in the same way as in Example 1. After an exposure time of 10 seconds, the following number of fully crosslinked wedge steps was obtained:

TABLE IV

| Halo compound | Neutral density filter | Sharp cut-off filter | Wedge step |
|---|---|---|---|
| 2,4-Bis-trichloromethyl-6-(5-methoxynaphth-1-yl)-s-triazine | yes | — | 8 |
|  | no | 455 | 3 |
| 2,4-Bis-trichloromethyl-6-methyl-s-triazine | yes | — | 4 |
|  | no | 455 | 1 |
| 2,4-Bis-trichloromethyl-6-phenyl-s-triazine | yes | — | 6 |
|  | no | 455 | 3 |
| Phenyl tribromomethyl sulfone | yes | — | 7 |
|  | no | 455 | 2 |

EXAMPLE 4

A solution of the following composition was spin-coated onto the layer support-specified in Example 1 so that, after drying, a layer weight of 2.5 g/m² was obtained:
1.8 pbw of a 33.4% strength solution of a methyl methacrylate/methacrylic acid copolymer having the acid number 110 and the average molecular weight 35,000 in butanone,
1.4 pbw of the monomer in accordance with Table V,
0.02 pbw of Eosine (C.I. 45 386),
0.03 pbw of the s-triazine specified in Example 1, and
0.049 pbw of 9-phenylacridine in
22.0 pbw of propylene glycol monomethyl ether.

The plates were processed as in Example 1, after which the number of fully crosslinked wedge st.eps given in Table V was obtained:

TABLE V

| Compound No. | Exposure time (seconds) | Neutral density filter | Sharp cut-off filter | Steps |
|---|---|---|---|---|
| 5 | 10 | yes | — | 6 |
|  | 10 | no | 455 | 4 |
| 6 | 20 | yes | — | 8 |
|  | 20 | no | 455 | 4 |

EXAMPLE 5

A printing plate was produced as described in Example 3, but using 2,4-bis-trichloromethyl-6-(4-styrylphenyl)-s-triazine as the halo compound. The printing plate was exposed using the expanded beam of an argon-ion laser and further processed as in Example 1.

The exposure results are shown by Table VI:

TABLE VI

| Wavelength (nm) | Energy in the laser beam (mW/cm²) | Exposure time (seconds) |
|---|---|---|
| 351.1 + 363.8 | 0.01 | 20 |
| 488.0 | 0.2 | 20 |
| 514.5 | 0.3 | 10 |

Printing trials carried out using these plates gave over 100,000 perfect prints.

EXAMPLE 6

A solution of the following composition was spin-coated onto the support material specified in Example 1 so that a layer weight of 2.5 g/m² was obtained:
2.8 pbw of the terpolymer solution given in Example 1,
0.7 pbw of compound 2,
0.7 pbw of trimethylolethane triacrylate,
0.02 pbw of Eosine,
0.03 pbw of 2,4-bistrichloromethyl-6- (4-styrylphenyl)-s-triazine, and
0.049 pbw of 9-phenylacridine in 22.0 pbw of propylene glycol monomethyl ether.

The plate was processed in the same way as in Example 1. After exposure for 40 seconds, the following number of fully crosslinked wedge steps was obtained in each case:

| Neutral density filter | Sharp cut-off filter | Steps |
|---|---|---|
| yes | — | 6 |
| no | 455 | 4 |

EXAMPLE 71

Solutions of the following composition were spin-coated onto the support material specified in Example 1 under the same conditions as there:

2.8 pbw of the terpolymer solution specified in Example 1,
1.4 pbw of compound 5,
0.02 pbw of Eosine,
0.03 pbw of 2,4-bis-trichloromethyl-6-(4-styrylphenyl)-s-triazine,
0.049 pbw of 9-phenylacridine, and
0.1 pbw of carbonyl compound in
22.0 pbw of propylene glycol monomethyl ether.

The coated plates were dried as in Example 1 and provided with a protective coating. The exposure was carried out from 400 to 700 nm using a graduated interference filter using parallel light from a 500 W incandescent bulb at a distance of 75 cm. After development as in Example 1, complete curing was found in the spectral regions specified:

| Carbonyl compound | Exposure time (seconds) | Spectral region (nm) |
| --- | --- | --- |
| 4-Dimethylamino-4'-methoxydibenzal acetone | 30 | 450–550 |
| 3-Acetyl-7-diethylaminocoumarine | 30 | 400–585 |

Without the carbonyl compound, a cured region was obtained after 30 seconds from 400–430 nm and from 485–560 nm. Without the carbonyl compound and without the dye, a cured region was obtained from 400–430 nm.

The effectiveness of the added compounds with respect to the resolving power was determined using a test pattern, the FOGRA-PMS wedge, and read off on the copy. The above-mentioned mixture without dibenzal acetone or coumarine derivative gave in each case a resolution which was worse by at least one step in the K field of the test pattern.

EXAMPLE 8

The coating solution from Example 5 was spin-coated onto a biaxially stretched 35 μm thick polyethylene terephthalate film so that, after drying, a layer weight of 5 g/m2 was obtained. The layer was post-dried for 3 minutes at 100° C. in a fan-assisted drying cabinet. The coating was subsequently laminated at 115° C. at a rate of 1.5 m/s onto a layer support comprising an insulating material with a 35 μm copper coating.

The coating was exposed for 30 seconds using a 5 kW metal halide lamp (distance 140 cm) under a sharp cut-off filter 455, as described in Example 1, and under a step wedge, and developed for 20 seconds in a spray processor after removing the film using 0.8% strength soda solution. Five fully crosslinked wedge steps were obtained. The crosslinked coating was resistant to the iron(III) chloride solution which is customary in printed circuit board technology. The etching resistance was good.

EXAMPLE 9

A printing plate was produced as described in Example 5, but using 0.02 pbw of the sodium salt of Eosine tetradecyl ester as the dye. After removal from this printing plate, the protective coating was colorless. In contrast, a protective coating sample from the printing plate from Example 5 clearly had a red color. The shadowing effect avoided by the long-chain alkyl group led to an increase in photo-sensitivity by a factor of 2 compared to the printing plate from Example 5.

What is claimed is:

1. A photopolymerizable mixture, consisting essentially of:
   (a) a polymeric binder,
   (b) an acrylate or alkacrylate or a polyhydric alcohol, comprising one or more groups which are photooxidizable on exposure in the presence of a photoreducible dye, and one or more urethane groups,
   (c) a photoreducible dye as a photoinitiator component,
   (d) a trihalomethyl compound which can be cleaved by irradiation, and
   (e) an acridine, phenazine or quinoxaline compound which acts as a photoinitiator.

2. A mixture as claimed in claim 1, wherein the acrylate or alkacrylate is a compound of the formula

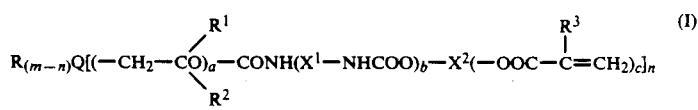

in which
Q denotes

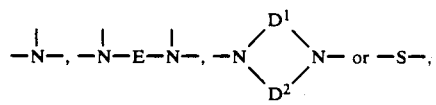

R denotes an alkyl, hydroxyalkyl or aryl group,
$R^1$ and $R^2$ each denote a hydrogen atom, an alkyl group or an alkoxyalkyl group,
$R^3$ denotes a hydrogen atom, a methyl group or an ethyl group,
$X^1$ denotes a saturated hydrocarbon group having 2 to 12 carbon atoms,
$X^2$ dentoes a (c+1)-valent saturated hydrocarbon group in which up to 5 methylene groups may be replaced by oxygen atoms,
$D^1$ and $D^2$ each denote a saturated hydrocarbon group having 1 to 15 carbon atoms,
E denotes a saturated hydrocarbon group having 2 to 12 carbon atoms, a cycloaliphatic group which has 5 to 7 ring members and which contains up to 2 N, O or S atoms as ring members, an arylene group having 6 to 12 carbon atoms, or a heterocyclic aromatic group having 5 or 6 ring members,
a denotes 0 or an integer from 1 to 4,
E denotes a saturated hydrocarbon group having 2 to 12 carbon atoms, a cycloaliphatic group which has 5 to 7 ring members and which contains up to 2 N, O or S atoms as ring members, an arylene group having 6 to 12 carbon atoms, or a heterocyclic aromatic group having 5 or 6 ring members,
a dentoes 0 or an integer from 1 to 4,
b denotes 0 or 1,
a+b is at least 1,
c denotes an integer from 1 to 3,
m denotes 2, 3 or 4, depending on the valency of Q, and n denotes an integer from 1 to m, it being possible for all radicals of the same definition to be identical to or different from one another.

3. A mixture as claimed in claim 2, wherein n=m.

4. A mixture as claimed in claim 2, wherein $R^3=CH_3$.

5. A mixture as claimed in claim 2, wherein $a+b=1$ or 2.

6. A mixture as claimed in claim 1, wherein the photoreducible dye is a xanthene, thiazine, pyronine, porphyrine or acridine dye.

7. A mixture as claimed in claim 6, wherein the xanthene dye is a compound of the formula II

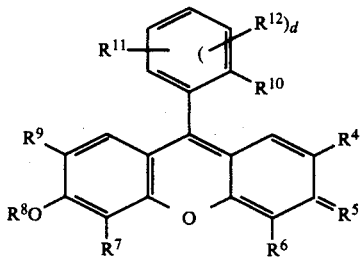

in which $R^4$ and $R^9$ are identical or different and denote hydrogen or halogen atoms, nitro or hydroxyl groups or groups of the formula —HgOH, $R^6$ and $R^7$ are identical or different and denote hydrogen or halogen atoms or hydroxyl groups, $R^5$ denotes 0 or $(+)$NHalkyl $X(-)$, $R^8$ denotes a hydrogen atom, an alkali metal, ammonium or trialkylammonium cation, or an alkyl or acyl group, $R^{10}$ denotes a hydrogen atom or a COOR$^{13}$ group, $R^{11}$ denotes a hydrogen or halogen atom or an amino group, $R^{12}$ denotes a hydrogen or halogen atom, $R^{13}$ denotes a hydrogen atom, an alkali metal or ammonium cation, an alkyl group or a polymeric radical, X denotes an anion, and d denotes zero or an integer from 1 to 3.

8. A mixture as claimed in claim 7, wherein the dye is a compound of one of the formulae III and IV

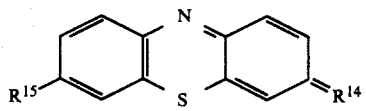

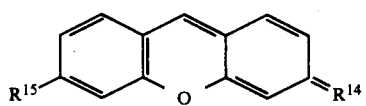

in which $R^{14}$ is one of the groups $=NH_2(+)$ $X(-)$, $=NHalkyl(+)$ $X(-)$ and $=N(alkyl)_2(+)$ $X(-)$ $R^{15}$ is an amino, alkylamino or dialkylamino group and X is an anion.

9. A mixture as claimed in claim 1, wherein the trihalomethyl compound which can be cleaved by irradiation is selected from the group consisting of an s-triazine substituted by at least one trihalomethyl group and one further group and an aryl trihalomethyl sulfone.

10. A mixture as claimed in claim 9, wherein the further group contains at least one aromatic ring which is connected to the triazine radical either directly or via a conjugated double bond system.

11. A mixture as claimed in claim 1, wherein the binder is insoluble in water and soluble in aqueous-alkaline solutions.

12. A mixture as claimed in calim 2, wherien a=0 in not more than one radical.

13. A mixture as claimed in claim 2, wherein a=1.

14. A photopolymerizable mixture, comprising:
about 10% to 80% by weight of an acrylate or alkacrylate of a polyhydric alcohol, comprising one or more groups which are photooxidiozable on exposure in the presence of a photoreducible dye, and one or more urethane groups, about 20% to 90% by weight of polymeric binder, and about 0.05% to 20% by weight, relative to the nonvolatile components of the mixture, of radiation-activatable polymerization initiators comprising (1) a photoreducible dye as a photoinitiator component (2) a trihalomethyl compoudn whcih an be cleaved by irradiation, and (3) an acridine, phenazine or quinoxaline compound which acts as a photoinitiator.

15. A photopolymerizable mixture as claimed in claim 1, which additionally contains a dibenzal acetone or coumarine compound (f).

16. A photopolymerizable recording material having a layer support and a photopolYmerizable layer, wherein the photopolymerizable layer comprises a mixture as claimed in claim 1.

17. A photopolymerizable mixture comprising:
(a) a polymeric binder, present in an amount sufficient to produce a uniform film, (b) an acrylate or alkacrylate of a polyhydric alcohol, comprising one or more groups which are photooxidizable on exposure in the presence of a photoreducible dye, and one or more urethane groups present in an amount sufficient to render exposed areas of said photopolymerizable mixture insoluble in developer solution, (c) a photoreducible dye as a photoinitiator component, (d) a trihalomethyl compound which can be cleaved by irradiation, and (e) an acridine, phenazine or quinoxaline compound which acts as a photoinitiator, wherein components c, d and e are present in an amount sufficient to increase the sensitivity of the mixture.

18. A photopolymerizable mixture as claimed in claim 1, wherein said acrylate or alkacrylate of a polyhydric alcohol and said photoinitiators are present in an amount sufficient to render exposed areas of said photopolymerizable mixture insoluble in developer solution.

19. A photopolymerizable mixture as claimed in claim 1, wherein said polymeric binder is present in an amount sufficient to produce a uniform film.

* * * * *

UNITED STATES PATENT AND TRADEMARK OFFICE
CERTIFICATE OF CORRECTION

PATENT NO. : 4,983,498

DATED : Jan. 8, 1991

INVENTOR(S) : Klaus Rode et al.

It is certified that error appears in the above-identified patent and that said Letters Patent is hereby corrected as shown below:

Column 16, line 45, "dentoes" should read --denotes--;

line 49, "1 to 15" should read --1 to 5--.

Column 18, line 15, Claim 13, "cliamed" should read --claimed--.

Column 18, line 19, Claim 14, "photooxidiozable" should read --photooxidizable--;

line 28, Claim 14, "compoudn whcih an" should read --compound which can--.

UNITED STATES PATENT AND TRADEMARK OFFICE
CERTIFICATE OF CORRECTION

PATENT NO. : 4,983,498

DATED : Jan. 8, 1991

INVENTOR(S) : Klaus Rode et al.

It is certified that error appears in the above-identified patent and that said Letters Patent is hereby corrected as shown below:

Column 18, line 36, Claim 16, "photopolYmerizable" should read --photopolymerizable--.

Signed and Sealed this

Thirty-first Day of August, 1993

Attest:

BRUCE LEHMAN

*Attesting Officer*  *Commissioner of Patents and Trademarks*